(12) United States Patent
Smith et al.

(10) Patent No.: US 6,512,664 B1
(45) Date of Patent: Jan. 28, 2003

(54) STATIC DISSIPATIVE SHUNT HOUSING

(75) Inventors: Charles H. A. Smith, Apple Valley, MN (US); Scott D. Ulrich, Apple Valley, MN (US); Ron F. Parson, Lakeville, MN (US); Randy A. Bork, Eagan, MN (US); William F. Pushee, Burnsville, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/501,530

(22) Filed: Feb. 9, 2000

Related U.S. Application Data

(60) Provisional application No. 60/126,399, filed on Mar. 26, 1999.

(51) Int. Cl.[7] .............................................. H01R 31/08
(52) U.S. Cl. ...................... 361/212; 361/220; 439/510
(58) Field of Search .................. 361/212, 220; 439/510

(56) References Cited

U.S. PATENT DOCUMENTS

| | | | |
|---|---|---|---|
| 4,795,602 A | * | 1/1989 | Pretchel et al. ............. 439/510 |
| 5,882,224 A | * | 3/1999 | Gauker ........................ 439/510 |
| 6,036,534 A | * | 3/2000 | Hoyt et al. .................. 439/510 |

* cited by examiner

*Primary Examiner*—Fritz Fleming
(74) *Attorney, Agent, or Firm*—Jennifer Buenzow

(57) ABSTRACT

An electrical connector is disclosed. The electrical connector includes a housing made of a near insulative material. The near insulative material has a resistance to current flow in the presence of low voltage current and has a surface resistivity which allows sufficient current flow to dissipate static electrical charges. The housing has a surface resistivity level within the range of $10^4$ to $10^{10}$ ohms per square, and preferably within the range of $10^5$ to $10^8$ ohms per square. The material used for the housing has negligible current flow in the presence of low voltage current such as when the conductor is conducting signals or electricity during normal operations. The current flow is in an amount sufficient to dissipate a static charge on the housing to a level where placing the jumper onto a set of pins will not produce a failure in a microchip electrically coupled to the jumper.

17 Claims, 7 Drawing Sheets

STATIC DISSIPATIVE SHUNT HOUSING

RELATED APPLICATION

This application claims the benefit of U.S. Provisional Application Serial No. 60/126,399, filed Mar. 26, 1999 under 35 U.S.C. 119(e).

FIELD OF THE INVENTION

The present invention relates generally to the field of electrical connectors. More particularly, this invention relates to a shunt or jumper for connecting pins in computers and components of computers, such as disc drives.

BACKGROUND OF THE INVENTION

Shunts or jumper connectors include a conductive path that is surrounded by an insulative housing. The insulative housing retains a static charge that accumulates and may not dissipate. The insulative housing on some shunts may develop a static charge as high as 2000 volts. Typically, a shunt is connected to a pin or connector on a circuit board when setting up a device. Certain devices or computers have features and options that the purchaser or customer can configure externally. These options are selected by placing a jumper or shunt over a set of pins to enable options or features of the device or computer. The options or features that can be selected are limitless. For example, in a computer a jumper or shunt may be used to select features such as memory size, Central Processing Unit (CPU) clock speed, and other features. In a disc drive, options that are selected might relate to features such as motor delay, write protect, master/slave, or identification bit selection.

Typically, the housing material of shunts is a very good insulator. Charges can be built up on the insulative material due to handling of the shunt. Any handling of an insulator can build up charges. Physical rubbing generates a static charge on the housing material. A static charge can even be produced by rubbing the shunt or jumper on an electrostatic discharge mat. In most instances, a static charge remains on the larger flat sides of the shunt. Once charged, the insulative property of the housing material prevents movement of charge. For example, when a charged shunt or jumper is placed on a grounded stainless steel plate, the charge from the side of the shunt contacting the grounded plate is discharged while the charge from the opposite side remains. The shunt can remain on the grounded plate for hours without movement of the charge from the ungrounded side of the shunt.

FIG. 10 is an isometric view of a shunt 1000 having a non-static dissipative housing 1004. The shunt 1000 includes a housing 1004 and an electrical conductor 1003. As shown, static charge, shown as plus symbols (+), accumulates on the housing 1004. When a shunt is charged, the metal connector 1003 inside the shunt or jumper takes on the opposite charge from the charge on the insulative housing 1004, as depicted by negative charge signs (−). The opposite charge occurs in response to the field on the housing material. When the jumper or shunt is attached to a set of pins, the static charge, if any, is immediately discharged into the circuit formed. If the metal connector first contacts a ground pin, the static charge is passed to ground. In this instance, no failure occurs. A problem occurs when the metal connector first contacts the microchip or microprocessor side of the circuit formed. When the charge is dissipated in a microprocessor or microchip, failures may occur, especially in microchips with thinner lines or traces which are on close centers.

When a shunt is charged, the metal connector inside the shunt or jumper takes on the opposite charge of the insulative housing. The opposite charge occurs in response to the field on the housing material. When the jumper or shunt is attached to a set of pins, the induced charge on the metal connector is immediately discharged into the circuit formed. If the metal connector first contacts a ground pin, the static charge is passed to ground. In this instance, no failure occurs. The problems occur when the metal connector first contacts the microchip or microprocessor side of the circuit formed. When the charge is dissipated in a microprocessor or microchip, failures may occur, especially in microchips with reduced features sizes (thinner traces and dielectrics, and smaller junctions).

Microchips with reduced features sizes are pervasive in today's electronic devices. In the past, microchips with larger features sizes had less susceptibility to Electro-Static Discharge (ESD) damage. In essence, the microchips with larger feature sizes are sufficiently substantial to withstand an electrostatic discharge caused by a static charge on the housing of a shunt or jumper.

A constant goal of microchip manufacturers is to miniaturize the device by reducing feature sizes. Some microprocessors have in excess of 10,000,000 gates or junctions on a single chip. The miniaturization of electronic components in semiconductor devices, such as the integrated circuits of microchips, results in extremely small feature sizes. In other words, miniaturization of microchips and more specifically the number of features. The small feature sizes make microchips more vulnerable to ESD damage.

Miniaturization of the feature sizes within microchips has reached a point where configuring options using jumpers or shunts have made microchips susceptible to ESD damage.

One solution to the problem is to provide the circuit with filters capable of withstanding an ESD event. The filters pass ESD spikes to ground or absorb the ESD spike before it damages the circuit. Adding filters is contrary to miniaturization of semiconductor devices. Filters and the related connectors require space. The use of filters also adds to the cost of the semiconductor devices or components. Adding filters increases the complexity of circuit design. Increased complexity also makes incorporating changes to a circuit more difficult.

One way to avoid ESD events in the situation where a shunt is going to be used is to place the shunts on circuits in an ionized environment. In the ionized environment, the static charges are neutralized. This solution is fine for a factory, however, many of the users do not have access to such an environment. Many of the users are placing shunts on circuits in a home or work environment, so this is a less than optimal solution.

What is needed is a method or apparatus that prevents an ESD event or lessens the severity of an ESD event resulting from placing a jumper or shunt onto a circuit which includes microprocessors or microchips. If the ESD event can be prevented or lessened, then failures in microchips having small feature sizes will be prevented or much less likely to occur. What is also needed is a method or apparatus that can be used in a home or work environment without resulting in ESD damage.

SUMMARY OF THE INVENTION

A shunt or jumper type electrical connector is disclosed. The electrical connector, includes a housing, made of a near insulator material, such as polybutylene terephthalate. The near insulator material acts as an insulator but has the characteristic of dissipating an electrostatic charge. Thus, rather than maintaining an electrostatic charge on the housing of the shunt for a long period of time, the housing dissipates the electrostatic charge rather quickly. As a result, when the shunt or jumper is placed by the user to select various options or features of an electronic device, the static charge on the housing and induced charge on the electrical contact within the housing is either eliminated or dramatically reduced to a level that will not cause a failure in a microchip or microprocessor.

As previously mentioned, the disclosed shunt connector includes a housing made of a near insulative material, and an electrical contact positioned within the housing of near insulative material. The electrical contact is for connecting two pins in an electrical device. The near insulative material has a resistance to current flow in the presence of voltage and has a surface resistivity that allows sufficient charge movement to dissipate static electrical charges. The housing material for an ESD shunt application must have its surface resistivity range within $10^4$ to $10^{10}$ ohms per square. One such housing material is polybutylene terephthalate.

Advantageously, the connection between the shunt housing, and the integrated circuit board is made directly and does not need to be made in a special ionized environment. Thus, end users can still select features to configure the components and computers. Damage from electrostatic discharge will be lessened or eliminated. This will lower manufacturing time and the associated cost of repairing ESD damaged components. In addition, field reconfiguration can be accomplished without ESD damage to electronic devices.

DESCRIPTION OF THE PREFERRED EMBODIMENT

In the following detailed description of the preferred embodiments, reference is made to the accompanying drawings that form a part hereof, and in which are shown by way of illustration specific embodiments in which the invention may be practiced. It is to be understood that other embodiments may be utilized and structural changes may be made without departing from the scope of the present invention.

The invention described in this application is useful with all types of electrical devices and more specifically with all types of components for use in a computer. For example, the jumper is useful for any card that may be included in the computer, such as a motherboard or any card that may attach to the motherboard. Furthermore, the jumper or shunt described is useful for any sort of input output device or peripheral device that is attached to a computer. One such peripheral device is a disc drive.

Figure 1:
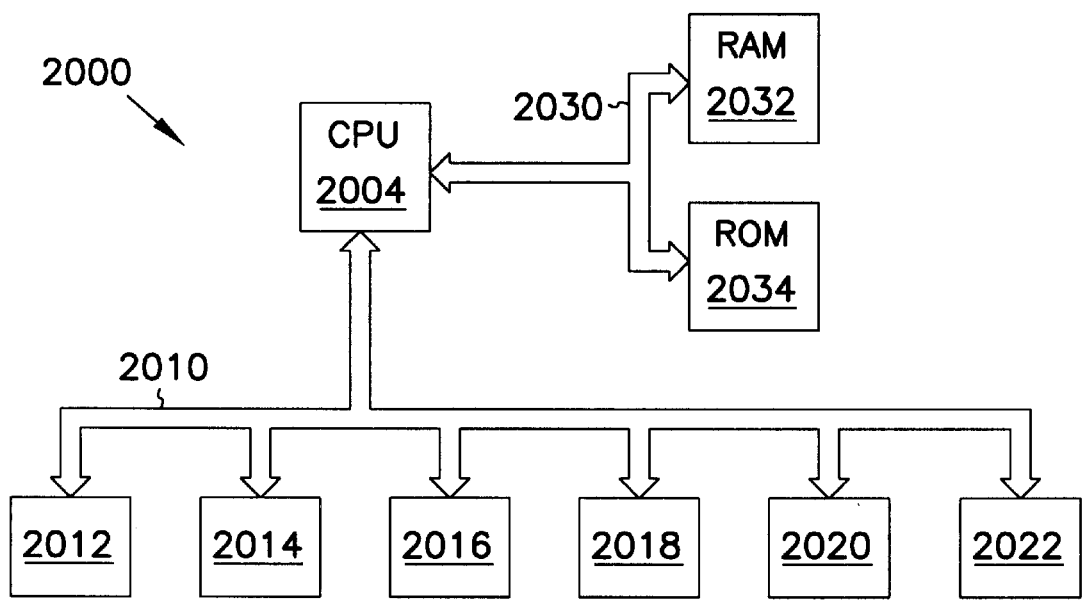
FIG. 1 is a schematic view of a computer system.

FIG. 1 is a schematic view of a typical computer system in which the shunt or jumper 300 may be used. The computer system 2000 may also be called an electronic system or an information handling system, and includes a central processing unit, a memory, and a system bus. The information handling system includes a central processing unit 2004 coupled to a read-only memory 2034. A system bus 2030 communicatively couples the central processing unit 2004 to the random access memory 2032. Information handling system 2000 may also include an input/output bus 2010, and several peripheral devices, such as 2012, 2014, 2016, 2018, 2020 and 2022 may be attached to the input/output bus 2010. Peripheral devices may include hard disc drives, magneto optical drives, floppy disc drives, monitors, keyboards and other such peripherals. The electrical connector 300, may be coupled to any set of pins or other contacts associated with any portion of the computer system 2000, including the central processing unit 2004, the system bus 2030, the input/output bus 2010, the random access memory 2032, the read-only memory 2034 or any peripheral device.

It should be noted that the jumper 300 is not only useful in a computer or information handling system 2000, but is useful in any device that uses microprocessors or microchips. Many devices include microchips or microprocessors these days. For example, microprocessors are used in automobiles to control the air to fuel mixture. Sensors in the exhaust of an engine are also used to provide feedback regarding the air to fuel mixture. Microprocessors are used in toasters, industrial machinery, and many other sorts of devices. In addition, it is anticipated that microchips and microprocessors will become even more widely used in all devices in the future. Thus, the inventive jumpers or shunts 300 will be useful in all these devices.

A current use of the inventive shunts or jumpers is in a disc drive for a computer system. The inventive shunt or jumper 300 will be described using a disc drive and it should be understood that the invention is directed to the shunt or jumper by itself and furthermore, to the shunt or jumper used in combination with such a device as a disc drive.

Figure 2:
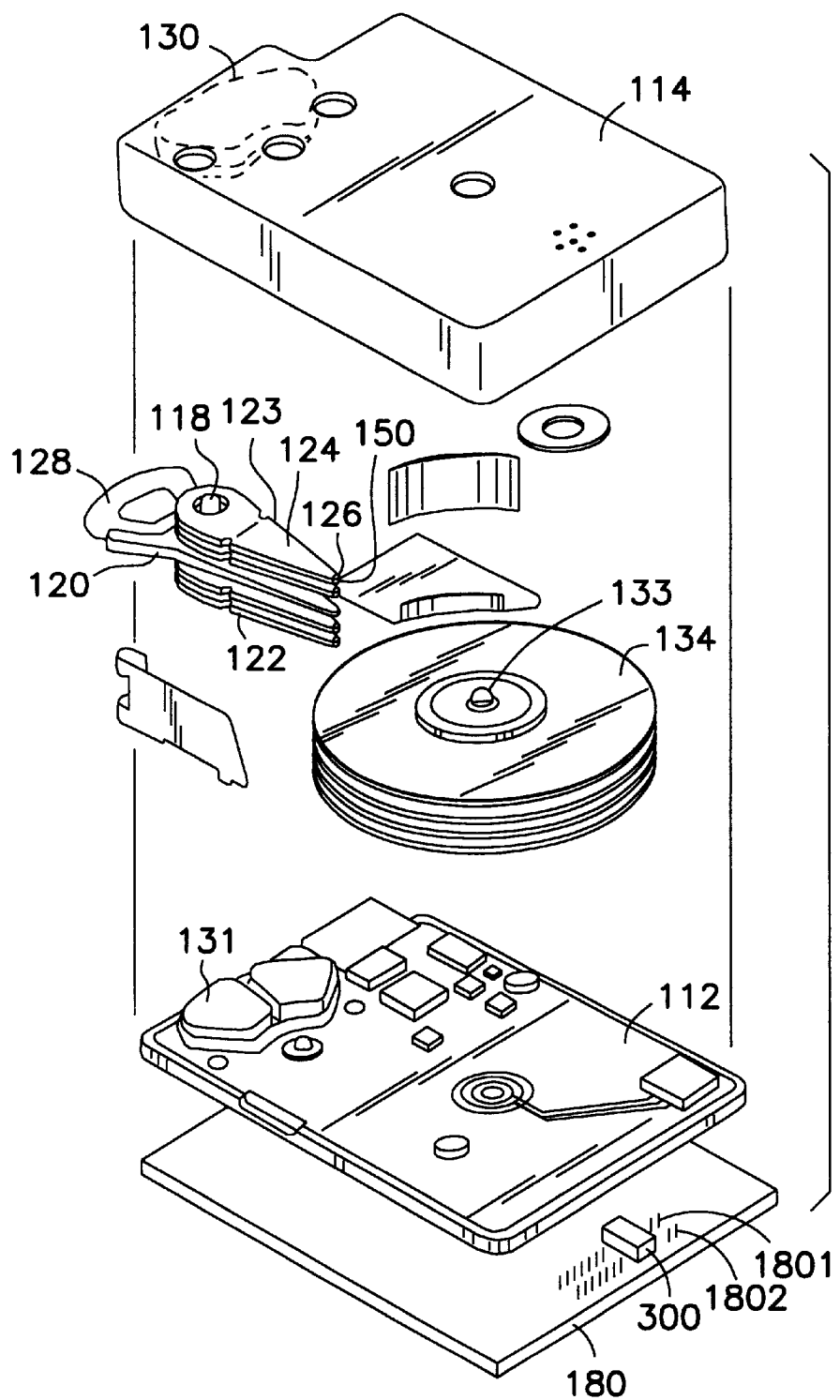
FIG. 2 is an exploded view of a disc drive with a multiple disc stack that includes a printed circuit board using a jumper.

FIG. 2 is an exploded view of one type of a disc drive 105 having a rotary actuator. The disc drive 105, includes a base 112, and a cover 114. The base 112, and cover 114 form a disc enclosure. Rotatably attached to the base 112 on an actuator shaft 118 is an actuator assembly 120. The actuator assembly 120 includes a comb-like structure 122 having a plurality of arms 123. Attached to separate arms 123 on the comb-like structure 122, are load beams or load springs 124. Load beams or load springs 124 are also referred to as suspensions. Attached at the end of each load spring 124 is a slider 126 that caries a magnetic transducer 150. The slider 126 with the transducer 150 form what is many times called the head. Many sliders have one transducer 150, and that is what is shown in the figures. This invention is equally applicable to sliders having more than one transducer, such as what is referred to as a MR or magneto resistive head in which one transducer 150 is generally used for reading, and another is generally used for writing. On the end of the actuator arm assembly 120 opposite the load springs 124, and the slider 126 is a voice coil 128. Attached within the base 112 are a first magnet 130, and a second magnet 131. As shown in FIG. 2, the second magnet 131 is associated with the cover 114. The first, and second magnets 130, 131, and the voice coil 128 are the key components of a voice coil motor that applies a force to the actuator assembly 120 to rotate it about the actuator shaft 118.

Mounted to the base 112 is a spindle motor. Spindle motor, includes a rotating portion called the spindle hub 133. In this particular disc drive, the spindle motor is within the hub. In FIG. 2, a number of discs 134 are attached to the spindle hub 133. In other disc drives a single disc or a different number of discs may be attached to the hub. Also, mounted to the base 112 is a printed circuit board 180. The printed circuit board 180 includes plurality of pins 1800 that include a first pin 1801 and a second pin 1802.

Also, shown in FIG. 2 is a jumper or shunt 300 that connects two of the plurality of pins 1800. The shunt or jumper 300 includes housing 301, includes a bottom portion 304 mounted to the base 112. Housing 301, is made of near insulative material which acts as an insulator when subjected to current having a low voltage. In other words, in the presence of a low voltage, current flow is negligible. The material conducts a current sufficient to substantially dissipate the static charge on the jumper or shunt 300. The housing material has a surface resistivity in the range of $10^5$ to $10^{10}$ ohms per square. One such housing material is polybutylene terephthalate. Polybutylene terephthalate has a surface resistivity in the range of $10^5$ to $10^{10}$ ohms per square so that in the presence of a high voltage electrostatic charge, the material conducts a current sufficient to substantially dissipate the static charge on the jumper or shunt 300. In the presence of a low voltage current such as when the conductor is conducting signals or electricity during normal operations, the current flow is negligible. Polybutylene terephthalate with the above mentioned properties has a surface resistivity in the range of $10^5$ to $10^{10}$ ohms per square.

As mentioned, a shunt or jumper 300 is used in a disc drive 100 to select certain features and options that must be enabled or selected to configure a computer system or to configure the drive so that it can attach to the computer system. For example, the shunt 300 may be used to select whether a disc drive is a master or slave drive within a computer system. Basically, shunts or jumpers 300 are used to change a circuit or to provide a circuit path to enable a feature or select one setting over another setting. Shunts may also be used to set a position or bus address on the bus 2010 of the computer 2000.

Figure 3:
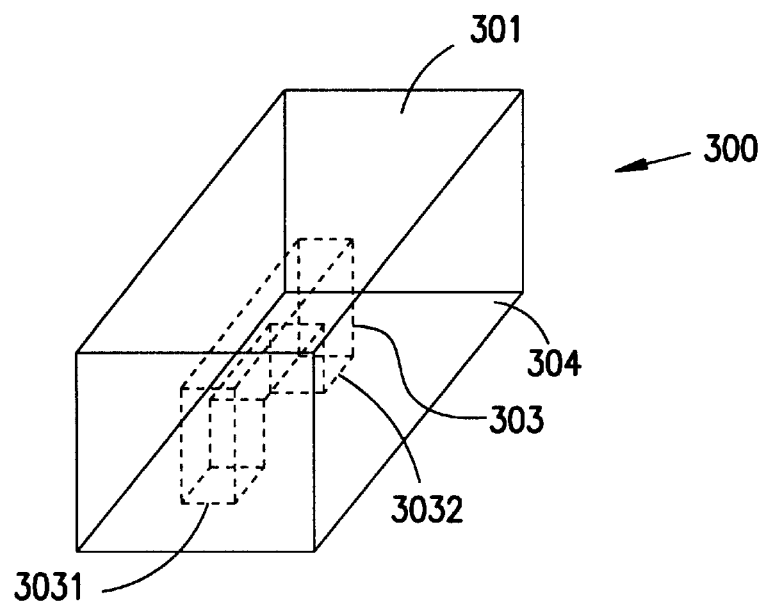
FIG. 3 is an isometric view of a shunt having a static dissipative housing.

FIG. 3 is an isometric view of one embodiment of a shunt or jumper 300. The shunt housing 301 includes an electrical conductor 303. The electrical conductor 303 is shown in phantom within the housing 301. The electrical conductor 303 includes a conductive pathway having a first end 3031 and a second end 3032. Each end 3031, 3032 includes a contact. The shunt housing 301 includes the conductor 301 or, in essence, the shunt housing 301 surrounds the conductor 303. In this embodiment, the electrical conductor is made of a conductive material, such as beryllium copper or phosphor bronze. However, in other embodiments the electrical conductors 303 may be made of other conductive materials. The ends 3031, 3032 each terminate on a surface 304 of the shunt or jumper 300. The surface 304 is the surface that normally contacts a circuit board 180 of an electrical device. Some might refer to surface 304 as a bottom surface of the jumper or shunt 300. Of course, referring to surface 304 as a bottom surface does not imply any sort of orientation of the part. For example, a jumper 300 might be placed in a disc drive or a computer 100 and then turned to another orientation. By turning the device and the jumper 300, the bottom surface 304 may be placed on the side or in another orientation.

The shunt housing 301 is made of a near insulative material. The near insulative material has a resistance to current flow in the presence of low voltage current and also has a surface resistivity which allows sufficient current flow to dissipate static electrical charges. The housing has a surface resistivity level within the range of $10^4$ to $10^{10}$ ohms per square, and preferably within the range of $10^5$ to $10^8$ ohms per square. One such housing material is polybutylene terephthalate. Any material having the above properties can be used. Most importantly, the material used for the housing must have negligible current flow in the presence of low voltage current such as when the conductor 301 is conducting signals or electricity during normal operations. During normal operations the signals have current levels on the order of milliamps. Typically, the voltage associated with such circuits is in the range of +/−15 volts. Essentially, the material used will act substantially as an insulator when used under normal operating conditions. The material used also will conduct current when subjected to high voltage situations, such as when a static charge is placed on the housing. With a surface resistivity in the range of $10^4$ to $10^{10}$ ohms per square, and preferably within the range of $10^5$ to $10^8$ ohms per square, any electrostatic charge on the housing will result in a current that "bleeds off" the static charge in a relatively short time. The charge may not be totally removed by the current, but the resulting current flow is in an amount sufficient to dissipate static charge on the housing to a level where placing the jumper onto a set of pins will not produce a failure in a microprocessor or other microchip that may be electrically coupled to the pins 1800 and the jumper 300.

Figure 4:
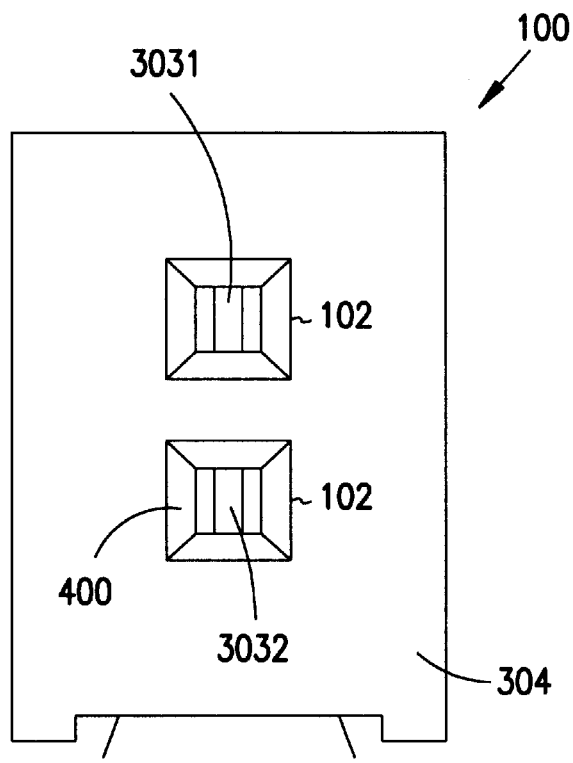
FIG. 4 is a bottom view of a shunt dissipative housing where the two attachment openings are shown from circuit board perspective.

FIG. 4 is a bottom view of the shunt 300. Surface 304 is presented in FIG. 4. Shunt 300 and more particularly surface 304, includes two openings 410 and 412 located on the surface 304 of the shunt housing 301. Each of the two openings 410 and 412 of the shunt housing 100 has beveled edges 420 and 422. The beveled edges 420, 422 are lead in features that are used to lead pins 1800 into engagement with the dual wipe contact ends 3031 and 3032 of the conductor 303. The pin lead in feature 400 prevents the contact ends 3031 and 3032 of the conductor 303 from being damaged due to an oblique angle insertion of pins 1800. The beveled edges 420, 422 are positioned at or near the surface 304 of the shunt housing 301 where the conductor 303 terminates.

Figure 5:
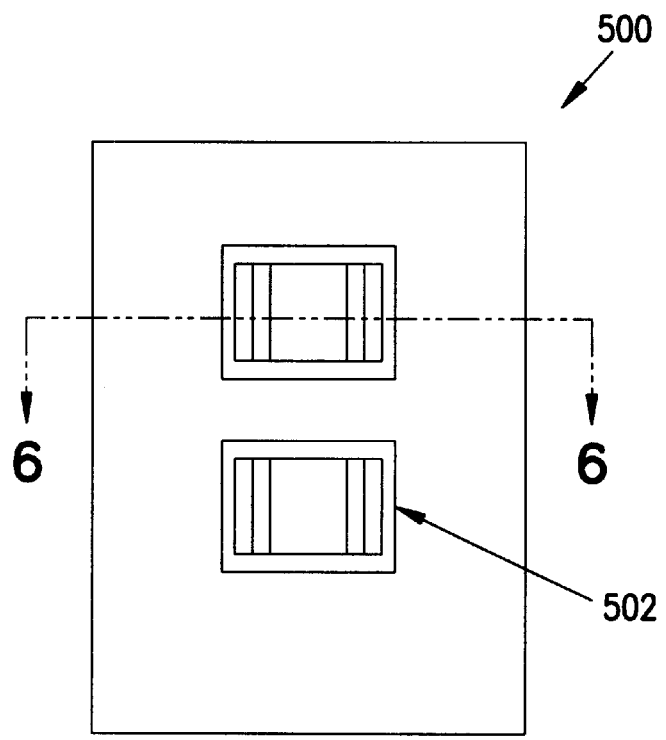
FIG. 5 is a top view of another embodiment of a shunt dissipative housing where the two attachment openings are shown from the circuit board perspective.
Figure 6:
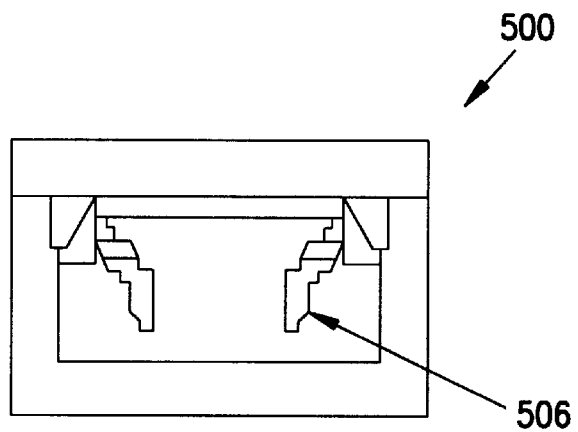
FIG. 6 is an end view of another embodiment of a shunt dissipative housing along line 6—6 of FIG. 5.

FIGS. 5 and 6 shows two views of another shunt 500. Shunt 500 includes a contact wire 506, which is coupled to an integrated circuit (not shown). Electrical contacts or contact wire 506 can be made of any conductive material such as beryllium copper alloy, or phosphor bronze. Contact plating for the contact wire 506 can be any conductive plating such as gold or palladium nickel with gold flash. The housing material of the shunt 500 essentially surrounds the conductor yet leaves a pair of connector ends 502 for receiving pins. The housing is made of a material in which the current flow in the housing is negligible in the presence of low voltage. The current flow in the housing material in the presence of high voltage is in an amount sufficient to dissipate a static charge on the housing. The housing has a surface resistivity level within the range of $10^5$ to $10^{10}$ ohms per square. Put another way, the current flow in the presence of high voltage is in an amount sufficient to dissipate static charge on the housing to a safe level. When the static charge is at a safe level, placing the jumper onto pins 1800 will not produce a current spike resulting in failure to an electrically coupled integrated circuit or microchip.

Figure 7:
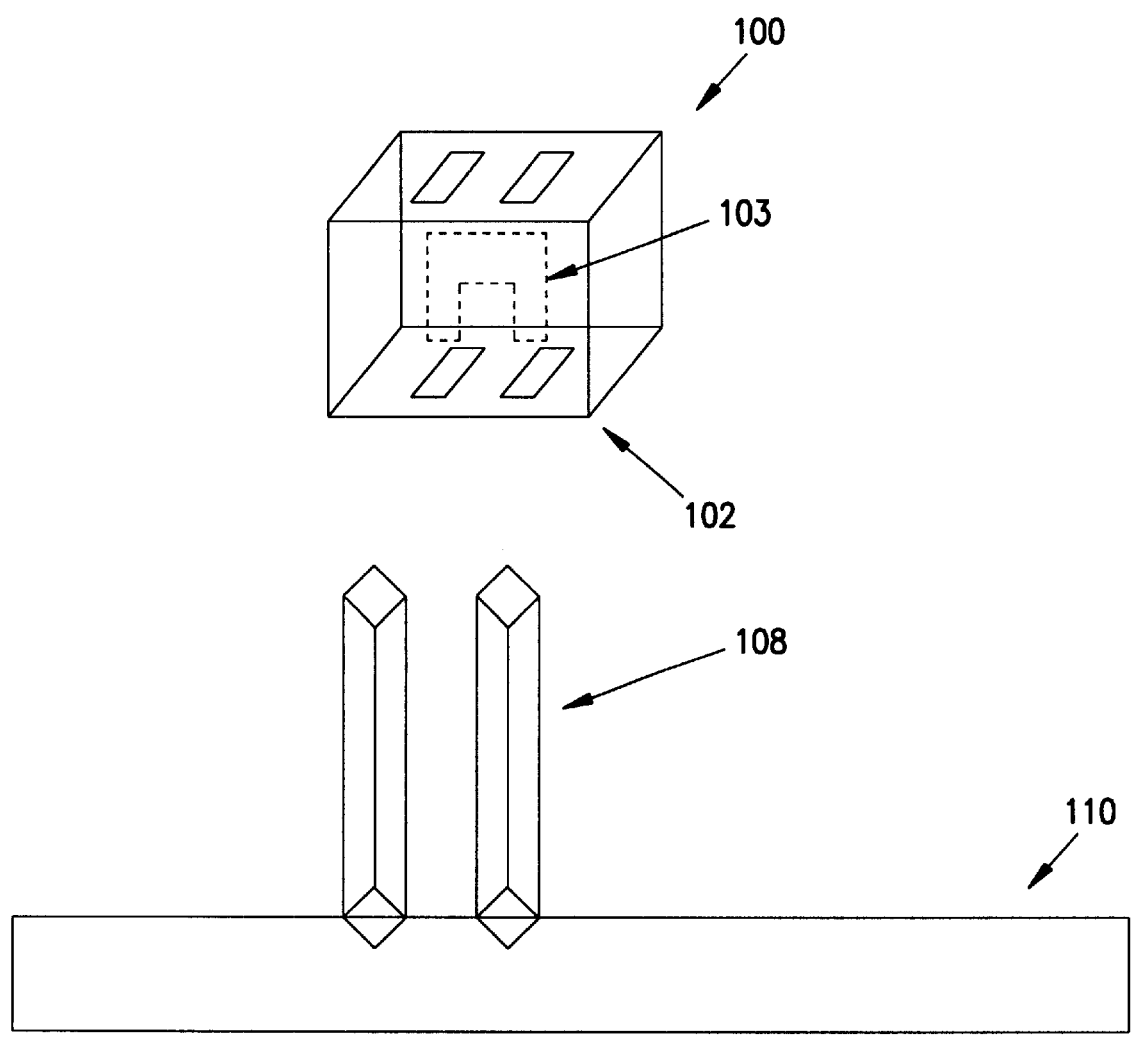
FIG. 7 is an exploded view of a shunt being placed onto the pins of an integrated circuit or printed circuit board.

FIG. 7 is an exploded view of a shunt 300 and connecting pins or jumper pins 1800 on a printed circuit board 180 or other substrate. Shunt 300, is made of a near insulative material. The shunt 300 is placed onto jumper pins 1801, 1802 of either a printed circuit board or on an integrated circuit 710. Electrical contacts 3031, 3032 are coupled to the jumper pins 1801, 1802. Shunt housing 100, can be manually inserted onto the jumper pins 1801, 1802 or it can be inserted by any mechanical means. Mechanical means may include using any automatic means such as a robotic arm to insert the shunt 300 onto the jumper pins 1801, 1802 of the integrated circuit 710. The insertion force needed to insert the shunt 300 onto pins 1801, 1802 is generally in the range of 100–600 grams.

Figure 8:
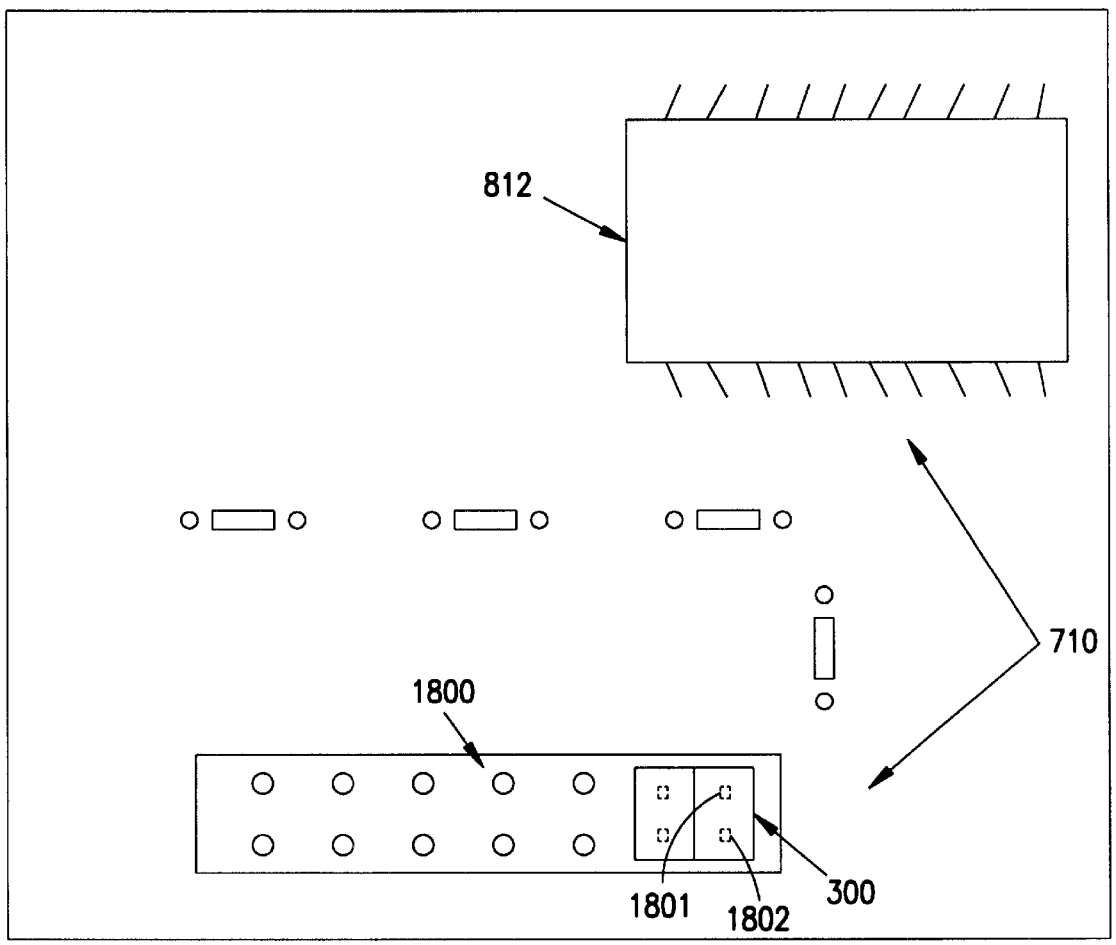
FIG. 8 is a top view of a printed circuit board including an integrated circuit and a microchip.

FIG. 8 is a top view of a printed circuit board 180, which includes an integrated circuit 710 and a microprocessor 812. Next to microprocessor 812 are jumper pins 1801, 1802. Shunt 300 is inserted onto the jumper pins 1801 and 1802 without causing a failure in the electrically connected microprocessor 812. The housing material of the shunt is selected so that current flow in the housing is negligible in the presence of low voltage yet the current flow in the housing material in the presence of high voltage is in an amount sufficient to dissipate a static charge on the housing. The housing has a surface resistivity level within the range of $10^5$ to $10^{10}$ ohms per square. Put another way, the current flow in the presence of high voltage is in an amount sufficient to dissipate static charge on the housing to a safe level before the shunt 300 is placed on pins 1801, 1802. When the static charge is at a safe level, placing the jumper onto pins 1801, 1802 will not produce a current spike in an electrically coupled integrated circuit or microprocessor 812 which in turn prevents failure in electrically connected components such as the microprocessor 812.

Figure 9:
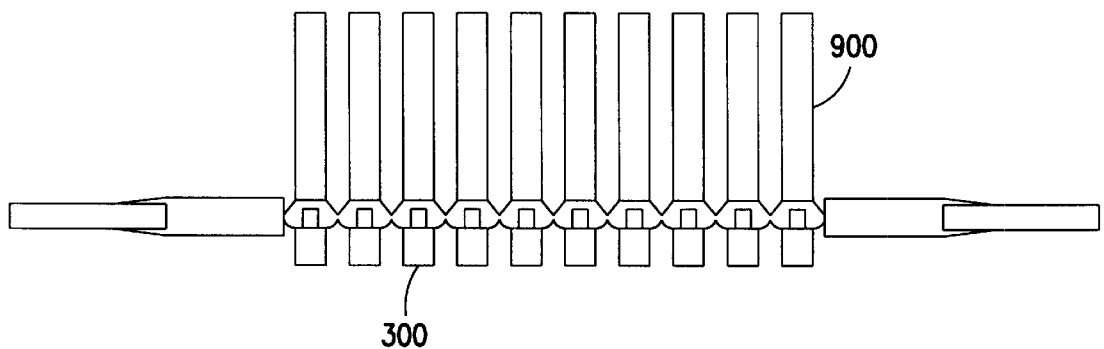
FIG. 9 is a top view of a molded manufacturing element that includes a backbone and a plurality of attached ESD shunts.
Figure 10:
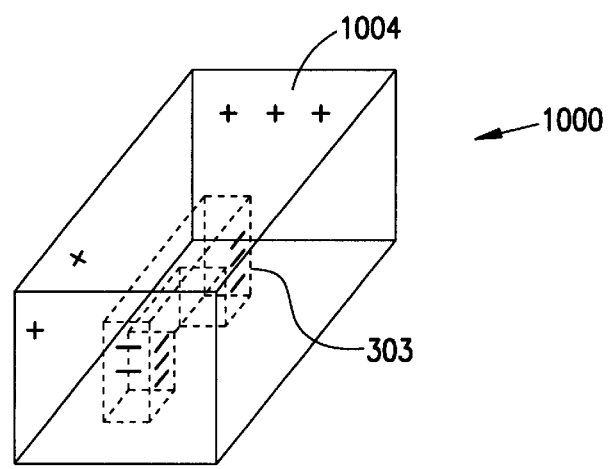
FIG. 10 is an isometric view of a shunt having a non-static dissipative housing with static charge accumulation and induced charge on metal contact.

FIG. 9 shows a molded item that has a plurality of shunts or jumpers 300 attached thereto. The shunts 300 are molded when manufactured. The mold (not shown) includes a backbone 900 as does the part resulting from the mold. Attached to a backbone 900 is a plurality of shunts 300. The shunts 300 are removed from the backbone 900 before use. Advantageously, the backbone 900 and attached shunts 300 are all made from the same material so that any static charge on the backbone 900 and shunts 300 is dissipated so as to minimize or eliminate any static charge that may be on the shunts 300 before using the same in an electrical device that may have fine circuitry.

Advantageously, the connection between the shunt housing, and the integrated circuit board is made directly and does not need to be made in a special ionized environment. Thus, end users can still select features to configure the components and computers. Damage from electrostatic discharge will be lessened or eliminated. This will lower manufacturing time and the associated cost of repairing electrostatic discharge ("ESD") damaged components. In addition, field repair can be accomplished without ruining expensive computer hardware components or microchips or microprocessors. The shunt housing protects the microprocessors on the sub-micron level from failing because the shunt housing is able to dissipate a static charge to a low enough level such that the lines or traces in a microprocessor or microchip will not be ruined by a current spike produced by the static charge, if any, that remains. When the shunt housing is electrically connected to an integrated circuit, a microchip or microprocessor, the amount of current discharged, will not ruin very fine electrical circuits or devices in the circuit.

CONCLUSION

In conclusion, a shunt connector 300 includes a housing 301 made of a near insulative material, and an electrical contact 303 positioned within the housing 301 of near insulative material. The electrical contact 303 is for connecting two pins 1801 and 1802 in an electrical device. The near insulative material has a resistance to current flow in the presence of low voltage current and has a surface resistivity which allows sufficient current flow to dissipate static electrical charges. The housing 300, 500 has a surface resistivity level within the range of $10^4$ to $10^{10}$ ohms per square. One such housing material is polybutylene terephthalate. The electrical connector within the housing includes a contact 3031, 3032. The housing also has a beveled edge 420, 422 near the contact to lead in pins being attached to the contact 3031, 3032. The electrical connector within the housing includes a contact 3031, 3032. The housing also has a beveled edge 420, 422 near the contact to lead in pins being attached to the contact 3031, 3032.

Also disclosed is a circuit which includes a first pin 1801, a second pin 1802, and a microchip 812 electrically coupled with one of the first pin 1801 or the second pin 1802. A jumper 300, 500 is for attaching the first pin 1801 and the second pin-1802. The jumper includes an electrical contact 303, 3031, 3032 and a housing 301 surrounding the electrical contact 303. The housing 301 is made of a material that dissipates static charges. The circuit further includes a circuit board 180. The circuit board 180 includes the first pin 1801 and the second pin 1802 as well as other sets of pins 1800 for receiving jumpers 300, 500. Placing a jumper 300, 500 on a particular set of pins 1800 changes settings associated with the circuit. The current flow in the housing is negligible in the presence of low voltage. The current flow in the presence of high voltage is in an amount sufficient to dissipate a static charge on the housing 301. The housing 301 has a surface resistivity level within the range of $10^5$ to $10^{10}$ ohms per square. Put another way, the current flow in the presence of high voltage is in an amount sufficient to dissipate static charge on the housing 301 to a level where placing the jumper 300, 500 onto the first 1801 and second pins 1802 will not produce a failure in the electrically coupled microchip 812. One possibility is that the housing is made of polybutylene terphthalate.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope to which such claims are entitled.

What is claimed is:

1. An shunt connector comprising:
   a housing made of a near insulative material; and
   an electrical contact positioned within the housing of near insulative material, the electrical contact for connecting two pins in an electrical device.

2. The shunt connector of claim 1, wherein the housing is made of polybutylene terephthalate.

3. The shunt connector of claim 1, wherein the near insulative material has a resistance to current flow in the presence of low voltage current and has a surface resistivity which allows sufficient current flow to dissipate static electrical charges.

4. The shunt connector of claim 3, wherein the housing has a surface resistivity level within the range of $10^4$ to $10^{10}$ ohms per square.

5. The shunt connector of claim 3, wherein the housing has a surface resistivity level within the range of $10^5$ to $10^8$ ohms per square.

6. The shunt connector of claim 3, wherein the housing has a surface resistivity level within the range of $10^5$ to $10^7$ ohms per square.

7. The shunt connector of claim 3 wherein the electrical connector includes a multi-wipe contact.

8. The shunt connector of claim 7 wherein the electrical connector has a beveled edge near the dual wipe contact to lead in pins being attached to the dual wipe contact.

9. A circuit comprising;
 a first pin;
 a second pin;
 a microchip electrically coupled with one of the first pin or the second pin; and
 a jumper for attaching the first pin and the second pin, the jumper including;
  an electrical contact; and
  a housing surrounding the electrical contact, the housing made of a material that has a surface resistivity which allows sufficient current flow to dissipate static charges.

10. The circuit of claim 9 further comprising;
 a circuit board including the first pin and the second pin, the circuit board further including other sets of pins for receiving jumpers, wherein placing a jumper on a particular set of pins changes settings associated with the circuit.

11. The circuit of claim 9 wherein the housing current flow in the housing is negligible in the presence of low voltage.

12. The circuit of claim 11 wherein current flow in the presence of high voltage is in an amount sufficient to dissipate a static charge on the housing.

13. The circuit of claim 12 wherein the housing has a surface resistivity level within the range of $10^5$ to $10^{10}$ ohms per square.

14. The circuit of claim 12 wherein the current flow in the presence of high voltage is in an amount sufficient to dissipate static charge on the housing to a level where placing the jumper onto the first and second pins will not produce a failure in the electrically coupled microchip.

15. The circuit of claim 9, wherein the housing is made of polybutylene terephthalate.

16. A disc drive having the circuit of claim 9, wherein the housing has a surface resistivity level within the range of $10^5$ to $10^{10}$ ohms per square.

17. An electrical connector comprising;
 an electrically conductive connector portion; and
 near insulative mean surrounding the electrical contact capable of dissipating an electrical charge.

* * * * *